(12) United States Patent
Boersma et al.

(10) Patent No.: US 9,684,749 B2
(45) Date of Patent: Jun. 20, 2017

(54) PIPELINE DEPTH EXPLORATION IN A REGISTER TRANSFER LEVEL DESIGN DESCRIPTION OF AN ELECTRONIC CIRCUIT

(71) Applicant: International Business Machines Corporation, Armonk, NY (US)

(72) Inventors: Maarten J. Boersma, Holzgerlingen (DE); Thomas Fuchs, Bietigheim-Bissingen (DE); David Lang, Tuebingen (DE); Friedrich Schroeder, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 14/603,435

(22) Filed: Jan. 23, 2015

(65) Prior Publication Data
US 2015/0234968 A1 Aug. 20, 2015

(30) Foreign Application Priority Data
Feb. 18, 2014 (GB) .................................. 1402849.2

(51) Int. Cl.
*G06F 17/50* (2006.01)
(52) U.S. Cl.
CPC ................................ *G06F 17/5045* (2013.01)
(58) Field of Classification Search
USPC .................. 716/101, 102, 104, 108, 133
See application file for complete search history.

(56) References Cited

U.S. PATENT DOCUMENTS

| 7,107,199 | B2 * | 9/2006 | Schreiber ............ G06F 17/5045 703/13 |
| 8,024,696 | B1 | 9/2011 | Srinivasan et al. |
| 8,499,262 | B1 | 7/2013 | Perry |
| 8,539,406 | B2 | 9/2013 | Mahar et al. |
| 8,566,768 | B1 | 10/2013 | Shukla et al. |

(Continued)

OTHER PUBLICATIONS

Boersma et al., "Pipeline Depth Exploration by Automatic Register Removal," United Kingdom Application No. 1402849.2, filed Feb. 18, 2014.

(Continued)

*Primary Examiner* — Brian Ngo
(74) *Attorney, Agent, or Firm* — Nolan M. Lawrence

(57) ABSTRACT

A list of input registers and output registers for a circuit design are provided. The circuit design is modified by traversing output connections paths for each input register and replacing any register in the output connection paths with a wire unless the register is a listed output register. An initial total cycle time value for the modified circuit design is determined. A gate level description for the modified circuit design is obtained by a macro synthesis with the initial total cycle time value. The total cycle time value for the modified circuit design is then varied in order to determine the theoretical limit of the modified circuit design. This theoretical limit is realized when negative slacks are present in a macro synthesis of the modified circuit design for a given total cycle time value. Based on this theoretical limit, the minimum pipeline depth of the circuit design is determined.

12 Claims, 6 Drawing Sheets

(56) References Cited

U.S. PATENT DOCUMENTS

| | | | |
|---|---|---|---|
| 2003/0144826 A1* | 7/2003 | Mandell | G06F 17/504 703/14 |
| 2005/0132316 A1* | 6/2005 | Suaris | G06F 17/5031 716/108 |
| 2008/0216038 A1* | 9/2008 | Bose | G06F 17/5072 716/118 |
| 2008/0276209 A1* | 11/2008 | Albrecht | G06F 17/5031 716/113 |
| 2010/0262941 A1 | 10/2010 | Fry et al. | |
| 2013/0111425 A1* | 5/2013 | Kumar | G06F 17/505 716/104 |
| 2013/0239081 A1* | 9/2013 | Oktem | G06F 17/5059 716/113 |
| 2013/0297278 A1 | 11/2013 | Narayanaswamy et al. | |

OTHER PUBLICATIONS

International Search Report dated Jul. 23, 2014 for International Application No. GB1402849.2, 3 pages.

* cited by examiner

… (1) …

PIPELINE DEPTH EXPLORATION IN A REGISTER TRANSFER LEVEL DESIGN DESCRIPTION OF AN ELECTRONIC CIRCUIT

CROSS-REFERENCE TO RELATED APPLICATION

This application is related to and claims the benefit of U.K. Patent Application No. GB 1402849.2, filed Feb. 18, 2014, which application is incorporated by reference herein for all purposes.

BACKGROUND

The present invention relates in general to the design of integrated circuits, and in particular to a method for pipeline depth exploration in a register transfer level design description of an electronic circuit, and a corresponding computer system for pipeline depth exploration in a register transfer level design description of an electronic circuit. Still more particularly, the present invention relates to a data processing program and a computer program product for pipeline depth exploration in a register transfer level design description of an electronic circuit.

A common case in today's server Hardware Description Language (HDL) design is that existing logic of an electronic circuit, e.g. a netlist or a VHDL source description, needs to be migrated to fit different cycle time requirements or to be adapted to a new technology. Further existing electronic circuit design with pipelined logic should be adapted to new technology. There is no automated way to explore the maximum frequency for optimal performance. Case studies have shown that even entire pipeline stage can be saved when logic is balanced across the different stages. Right now this could be done manually but it would be a very time-consuming task since slacks between registers are to be checked and moved or removed manually for slack balancing. Also chip performance is lost due to lack of pervasive cross-cycle optimization.

SUMMARY

According to the present invention, embodiments may include a method for pipeline depth exploration in a register transfer level design description of an electronic circuit having one or more of the features described herein, a computer system for pipeline depth exploration in a register transfer level design description of an electronic circuit having one or more of the features of described herein, a data processing program for pipeline depth exploration in a register transfer level design description of an electronic circuit having one or more of the features described herein, and a computer program product for pipeline depth exploration in a register transfer level design description of an electronic circuit having one or more of the features described herein. Some advantageous embodiments of the present invention are mentioned herein.

Accordingly, in an embodiment of the present invention a method for pipeline depth exploration in a register transfer level design description of an electronic circuit comprises the steps:

Providing a list of input registers and output registers for the circuit design to be modified; traversing output connections paths for each input register and replacing any register in the output connection paths by a respective wire unless the register is contained in the list of output registers; determining an initial total cycle time value for the modified registerless circuit design accounting for a register latch insertion delay time value; obtaining a gate level description for the modified circuit design by macro synthesis with the initial total cycle time value; varying the total cycle time value for the modified circuit design to determine theoretical limit of the modified circuit design; wherein the theoretical limit of the modified circuit design is realized when negative slacks are present in the macro synthesis of the gate level description for the modified circuit design with the corresponding total cycle time value.

In further embodiments of the present invention, the total cycle time value is repetitively reduced until negative slacks are present in the macro synthesis for the gate level description of the modified design.

In further embodiments of the present invention, the total cycle time value is reduced by a given time step size.

In further embodiments of the present invention, the initial total cycle time value is calculated according to $((T_{Total})=(n*(T_{cycle})-(n-1)\times(T_{LID}))$ with n representing current pipeline depth of the circuit design.

In further embodiments of the present invention, the pipeline depth of the circuit design is reduced, if the total cycle time value of the modified circuit design is lower than a certain threshold.

In further embodiments of the present invention, the theoretical limit of the modified circuit design comprises a maximum frequency or minimum pipeline depth of the circuit design.

In another embodiment of the present invention, a computer system for pipeline depth exploration in a register transfer level design description of an electronic circuit comprises a memory; and a processor in communication with the memory. The computer system is configured to perform the steps:

Loading a list of input registers and output registers for the circuit design to be modified; traversing output connections paths for each input register and replacing any register in the output connection paths by a respective wire unless the register is contained in the list of output registers; determining an initial total cycle time value for the modified registerless circuit design accounting for a register latch insertion delay time value; obtaining a gate level description for the modified circuit design by macro synthesis with the initial total cycle time value; varying the total cycle time value for the modified circuit design to determine theoretical limit of the modified circuit design; wherein the theoretical limit of the modified circuit design is realized when negative slacks are present in the macro synthesis of the gate level description for the modified circuit design with the corresponding total cycle time value.

In further embodiments of the present invention, the processor reduces the total cycle time value repetitively until negative slacks are present in the macro synthesis for the gate level description of the modified design.

In further embodiments of the present invention, the processor reduces said total cycle time value by a given time step size.

In further embodiments of the present invention, the processor calculates the initial total cycle time value according to $((T_{Total})=(n*(T_{cycle})-(n-1)\times(T_{LID}))$ with n representing a current pipeline depth of the circuit design.

In further embodiments of the present invention, the processor reduces the pipeline depth of the circuit design, if the total cycle time value of the modified circuit design is lower than a certain threshold.

In further embodiments of the present invention, the theoretical limit of the modified circuit design comprises a maximum frequency or minimum pipeline depth of the circuit design.

Yet another embodiment of the present invention includes a computer program product. The computer program product includes a computer readable storage medium having program instructions embodied therewith. These program instructions are executable by a computer to cause the computer to perform a method for identifying a minimum pipeline depth of a circuit design. As part of this method, a circuit design is identified. The identified circuit design includes an input register, an output register, and intermediate registers electrically coupled between an output connection of the input register and an input connection of the output register. The circuit design has a current pipeline depth. A modified circuit design is generated from the circuit design by replacing the intermediate registers with wires. A macro synthesis for a gate level description of the modified circuit design is run at a given total cycle time. As a result of the run, negative slacks are obtained. In response to obtaining negative slacks, the given total cycle time is compared to a threshold. Based on the comparison, it is determined that current pipeline depth of the circuit design is greater than the minimum pipeline depth for the circuit design.

The above, as well as additional purposes, features, and advantages of the present invention will become apparent in the following detailed written description.

BRIEF DESCRIPTION OF THE SEVERAL VIEWS OF THE DRAWINGS

A preferred embodiment of the present invention, as described in detail below, is shown in the drawings, in which.

DETAILED DESCRIPTION

Figure 1:
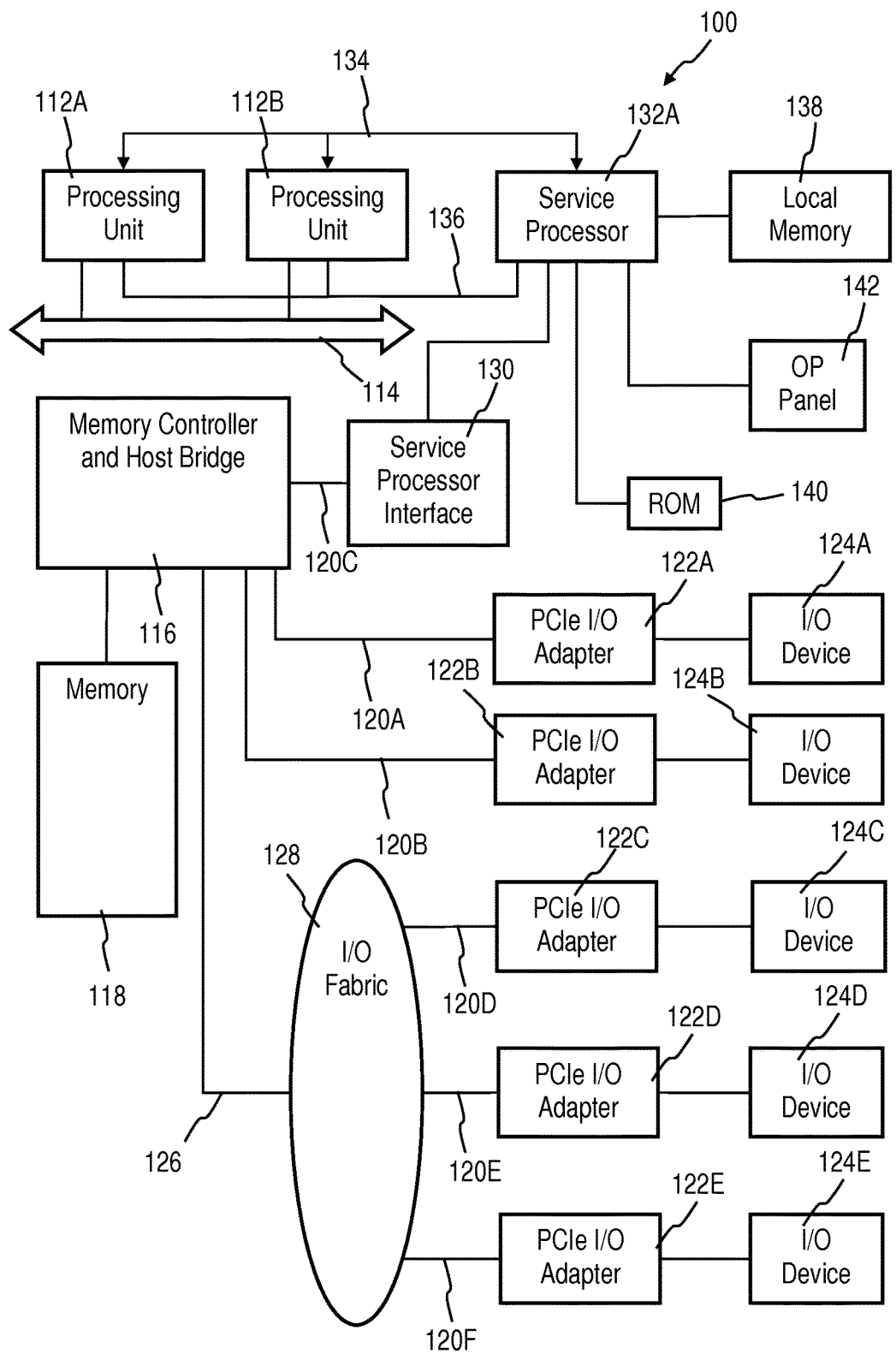
FIG. 1 is a schematic block diagram of a computer system for pipeline depth exploration in a register transfer level design description of an electronic circuit, in accordance with an embodiment of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The technical problem underlying the present invention is to provide a method for pipeline depth exploration in a register transfer level design description of an electronic circuit and a corresponding computer system for pipeline depth exploration in a register transfer level design description of an electronic circuit, which are able to automatically explore register transfer level design description of an electronic circuit and to improve frequency of the electronic circuit and to solve the above mentioned shortcomings and pain points of prior art pipeline depth exploration in a register transfer level design description of an electronic circuit.

In summary, to improve the short comings and problems of prior art solutions outlined in the background section, embodiments of the present invention introduce an automatic way to remove the intermediate register stages of a given design. Based upon that automated register-less synthesis runs are executed to get the theoretical maximum frequency and number of optimal register stages.

Embodiments of the present invention remove, in a manner automated by script, all registers in a pipeline between the input register and the output register and replace the registers by wire in HDL. Then a registerless synthesis is performed and the cycle time is varied to determine the theoretical limit of the electric circuit design.

In embodiments of the present invention, a data processing program for execution in a data processing system comprises software code portions for performing a method for pipeline depth exploration in a register transfer level design description of an electronic circuit when the program is run on the data processing system.

In yet another embodiment of the present invention, a computer program product stored on a computer-usable medium, comprises computer-readable program means for causing a computer to perform a method for pipeline depth exploration in a register transfer level design description of an electronic circuit when the program is run on the computer.

FIG. 1 depicts one embodiment of a computer system 100 in which aspects of the present invention may be implemented. The computer system 100 is, by way of example, a symmetric multi-processor (SMP) system having a plurality of processors 112A, 112B connected to a system bus 114. The system bus 114 is further connected to a combined memory controller and host bridge 116 which provides an interface to the system memory 118. The system memory 118 may be a local memory device or alternatively may include a plurality of distributed memory devices, such as dynamic random access memory (DRAM) devices. There may be additional structures in the memory hierarchy which are not depicted, such as on-board (L1) and second-level (L2) or third-level (L3) caches.

The memory controller and host bridge 116 also has an interface to peripheral component interconnect (PCI) express links 120A, 120B, 120C, for example. Each PCI express (PCIe) link 120A, 120B is connected to a respective PCIe adapter 122A, 122B, and each PCIe adapter 122A, 122B is connected to a respective input/output (I/O) device 124A, 124B. The memory controller and host bridge 116 may additionally have an interface to an I/O bus 126, which is connected to a switch (I/O fabric) 128.

The switch 128 provides a fan-out for the I/O bus to a plurality of PCI links 120D, 120E, 120F. These PCI links are connected to more PCIe adapters 122C, 122D, 122E, which in turn support more I/O devices 124C, 124D, 124E. The I/O devices may include, without limitation, a keyboard, a graphical pointing device (e.g., a mouse), a microphone, a display device, speakers, permanent storage device, e.g. hard disk drive, or an array of such storage devices, an optical disk drive, or a network card, etc. Each PCIe adapter provides an interface between the PCI link and the respective I/O device. The memory controller and host bridge 116 provides a low-latency path through which processors 112A, 112B may access PCI devices mapped anywhere within bus memory or I/O address spaces. The memory controller and host bridge 116 further provides a high-bandwidth path to allow the PCI devices to access the system memory 118. The switch 128 may provide peer-to-peer communications between different end points, and this data traffic does not need to be forwarded to the memory controller and host bridge 116 if it does not involve cache-coherent memory transfers. The switch 128 is shown as a separate logic component, but it could be integrated into the memory controller and host bridge 116.

In the illustrated embodiment, the PCI link 120C connects the memory controller and host bridge 116 to a service processor interface 130 to allow communications between I/O device 124A and a service processor 132. The service processor 132 is connected to the processors 112A, 112B via a JTAG interface 134, and uses as an attention line 136, which interrupts the operation of the processors 112A, 112B. The service processor 132 may have its own local memory 138, and is connected to read-only memory (ROM) 140, which stores various program instructions for system start up. The service processor 132 may also have access to a hardware operator panel 142 to provide system status and diagnostic information.

In alternate embodiments, the computer system 100 may include one or more modifications to the above-described hardware components or their interconnections, or additional components. The depicted example should not be construed as implying any architectural limitations with respect to the present invention.

Figure 2:
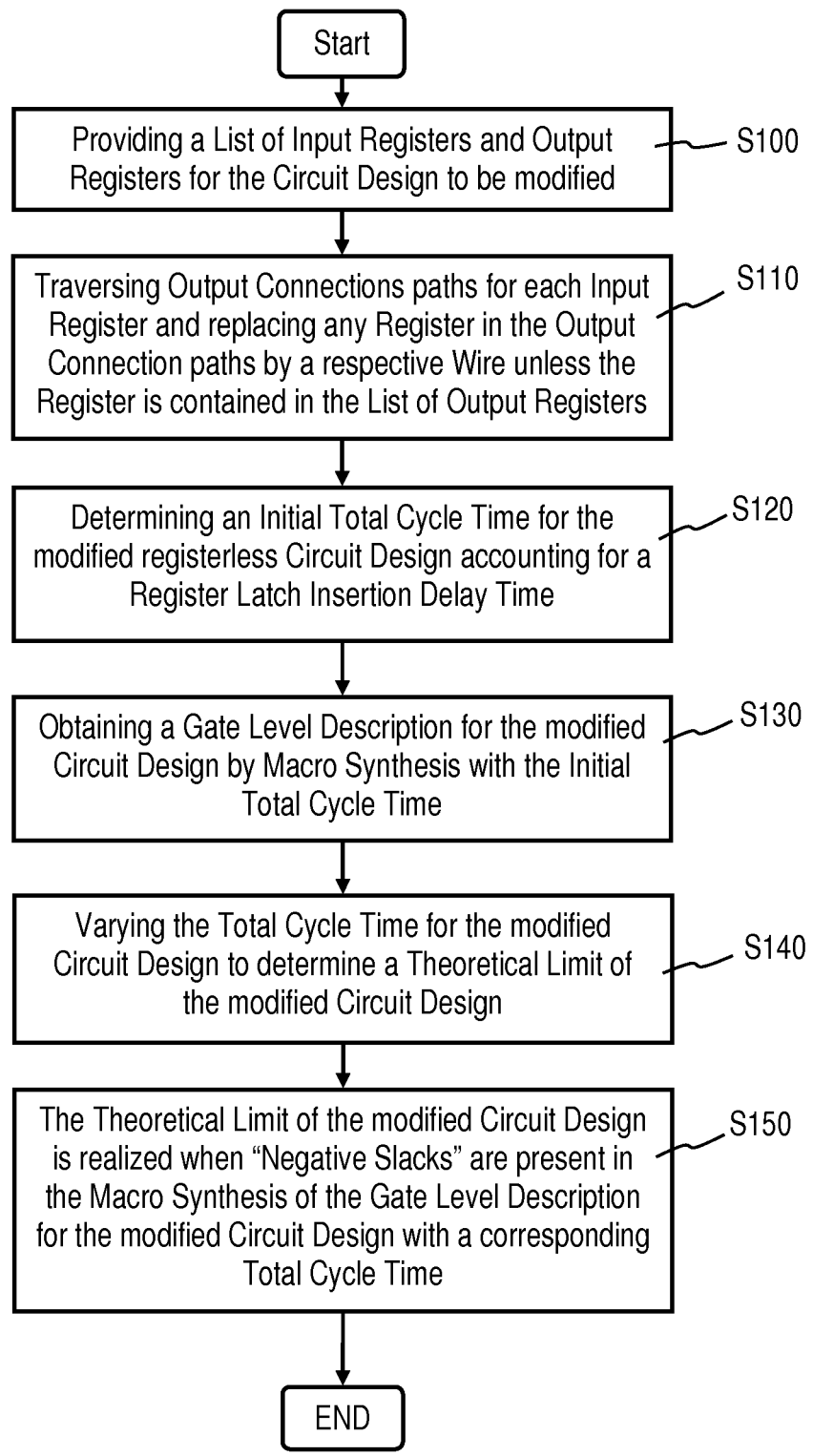
FIG. 2 is a schematic flow diagram of a method for pipeline depth exploration in a register transfer level design description of an electronic circuit, in accordance with an embodiment of the present invention.
Figure 3:
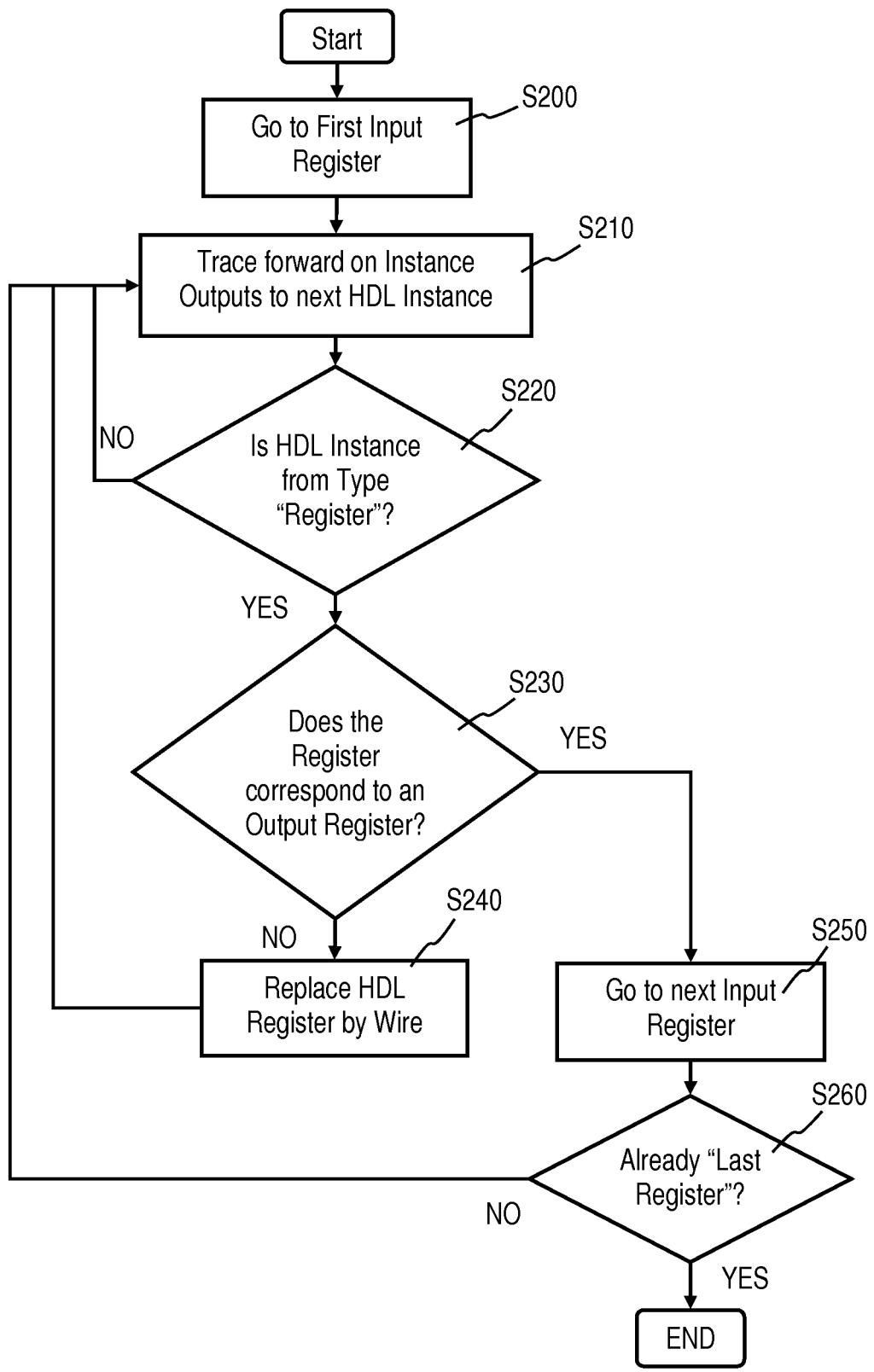
FIG. 3 is a more detailed schematic flow diagram of a process to replace registers in a pipeline between the input register and the output register by wire in HDL as part of the method for pipeline depth exploration in a register transfer level design description of an electronic circuit, in accordance with an embodiment of the present invention.
Figure 4:
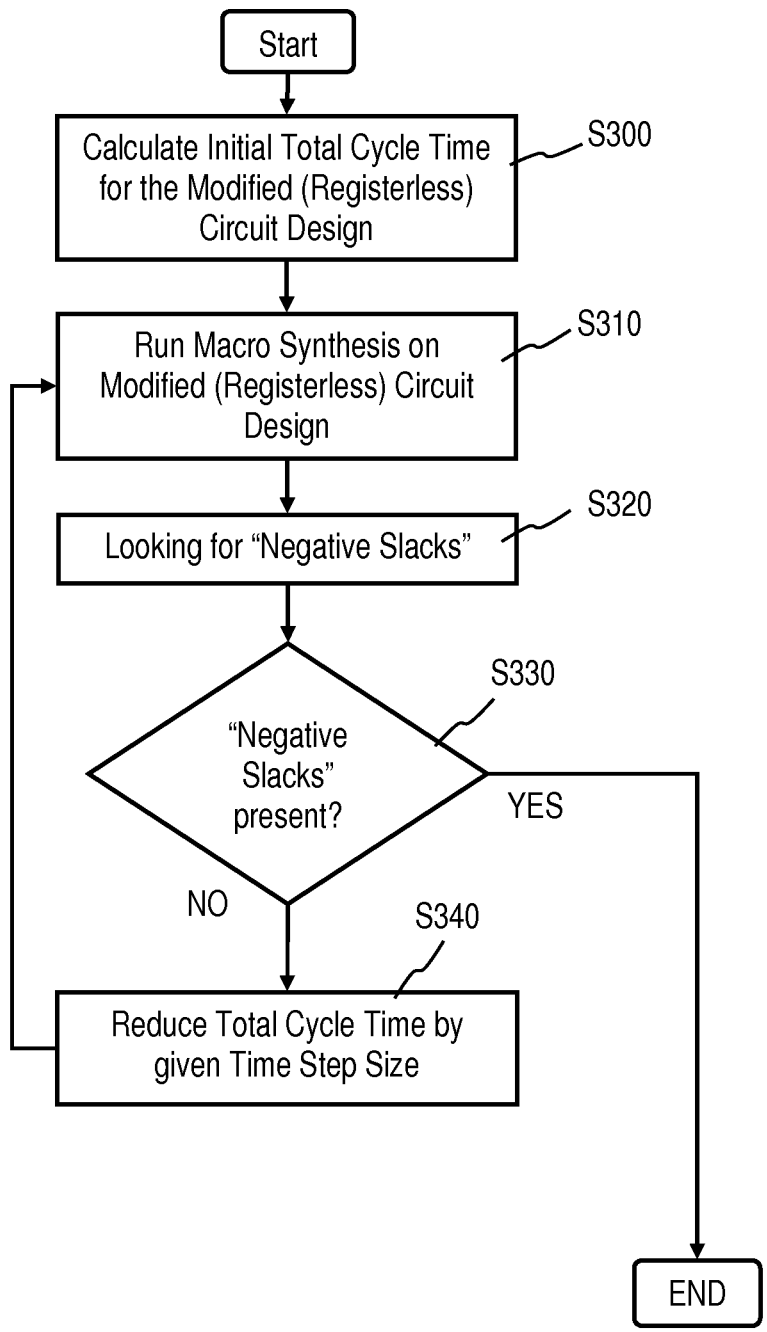
FIG. 4 is a more detailed schematic flow diagram of an automated synthesis run with cycle time adjustment as part of the method for pipeline depth exploration in a register transfer level design description of an electronic circuit, in accordance with an embodiment of the present invention.

FIG. 2 shows a method for pipeline depth exploration in a register transfer level design description of an electronic circuit, in accordance with an embodiment of the present invention, FIG. 3 shows a process to replace registers in a pipeline between an input register RI and an output register RO by wire in HDL as part of the method for pipeline depth exploration in a register transfer level design description of an electronic circuit, in accordance with an embodiment of the present invention, and FIG. 4 shows an automated synthesis run with cycle time adjustment as part of the method for pipeline depth exploration in a register transfer level design description of an electronic circuit, in accordance with an embodiment of the present invention.

Figure 5:
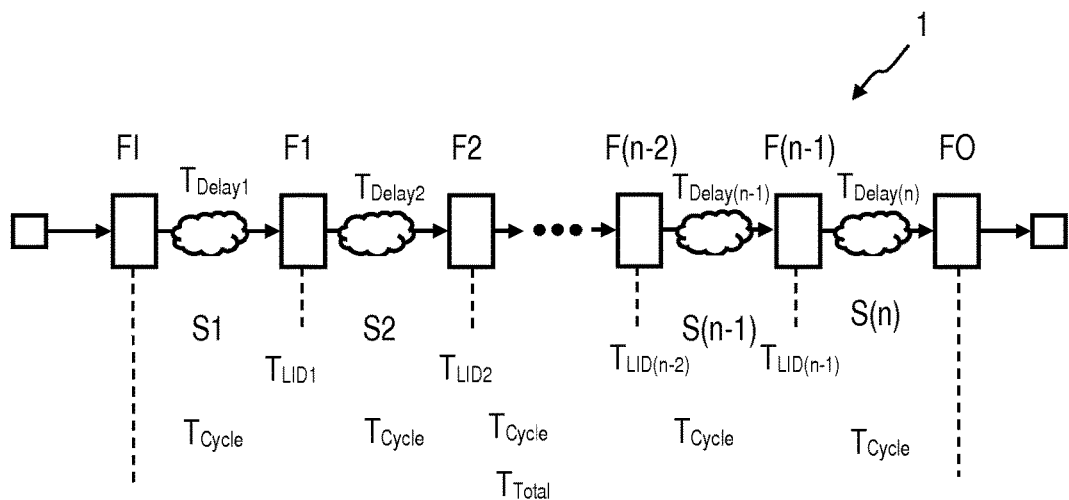
FIG. 5 is a schematic block diagram of a generic pipeline of an electronic circuit design.

FIG. 5 shows a generic n-stage pipeline 1 of an electronic circuit design comprising the input register FI and the output register FO and n logic stages S1 to S(n). Referring to FIG. 5 each logic stage S1 to S(n) is represented by a cloud comprising a certain number of logic paths and arranged between two registers FI, F1 to F(n−1), FO. A first logic stage S1 is arranged between the input register FI and a first pipeline register F1 and a n-th logic stage S(n) is arranged between a (n−1)-th pipeline register F(n−1) and the output register FO. $T_{Delay1}$ to $T_{Delay(n)}$ (Delay Time) each represents a delay time value for each logic stage S1 to S(n) required to execute the logic paths of the corresponding logic stage S1 to S(n). The delay time values $T_{Delay1}$ to $T_{Delay(n)}$ of the logic stage S1 to S(n) are smaller than the corresponding cycle time $T_{cycle}$ used to clock the n-stage pipeline 1 of the electronic circuit design. For further use and calculation the cycle time value $T_{cycle}$ is used. $T_{LID1}$ to $T_{LID(n-1)}$ (Latch Insertion Delay Time) each represents a insertion delay time value of the corresponding pipeline register F1 to F(n−1). The insertion delay time values $T_{LID1}$ to $T_{LID(n-1)}$ of the corresponding pipeline registers F1 to F(n−1) are approximately the same so for further use and calculation an average value $T_{LID}$ is used as latch insertion delay time value.

Referring to FIG. 2, in a step S100 the shown embodiment of the method for pipeline depth exploration in a register transfer level design description of an electronic circuit is provided with a list of input registers FI and output registers FO for the circuit design to be modified. In step S110 output connections paths are traversed for each input register FI and any register F1, ... F(n−1) in the output connection paths are replaced by a respective wire unless the corresponding register is contained in the list of output registers FO. In step S120 an initial total cycle time value $T_{Total}$ is determined for the modified registerless circuit design accounting for a register latch insertion delay time value $T_{LID}$. In step S130 a gate level description for the modified circuit design is obtained by macro synthesis with the initial total cycle time value $T_{Total}$. In step S140 the total cycle time value $T_{Total}$ for the modified circuit design is varied to determine theoretical limit of the modified circuit design. In step S150 the theoretical limit of the modified circuit design is realized when negative slacks are present in the macro synthesis of the gate level description for the modified circuit design with the corresponding total cycle time value $T_{Total}$. The theoretical limit of the modified electric circuit design comprises a maximum frequency or minimum pipeline depth of the electric circuit design.

Figure 6:
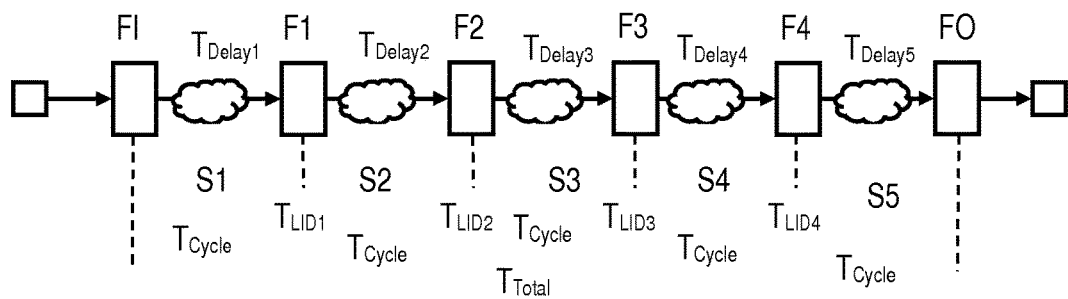
FIG. 6 is a schematic block diagram of an exemplary 5-stage pipeline of an electronic circuit design.

FIG. 6 shows an exemplary 5-stage pipeline 10A of an electronic circuit design comprising the input register FI and the output register FO and five logic stages S1 to S5. Referring to FIG. 6 each logic stage S1 to S5 is represented by a cloud comprising a certain number of logic paths and arranged between two registers FI, F1 to F4, FO. A first logic stage S1 is arranged between the input register FI and a first pipeline register F1 and a fifth logic stage S5 is arranged between a fourth pipeline register F4 and the output register FO. $T_{Delay1}$ to $T_{Delay5}$ each represents a delay time value for each logic stage S1 to S5 required to execute the logic paths of the corresponding logic stage S1 to S5. The delay time values $T_{Delay1}$ to $T_{Delay5}$ of the logic stage S1 to S5 are smaller than the corresponding cycle time $T_{Cycle}$ used to clock the 5-stage pipeline 10A of the electronic circuit design. For further use and calculation the cycle time value $T_{Cycle}$ is used. $T_{LID1}$ to $T_{LID4}$ each represents an insertion delay time value of the corresponding pipeline register F1 to F4. The insertion delay time values $T_{LID1}$ to $T_{LID4}$ of the corresponding pipeline registers F1 to F4 are also approximately the same so for further use and calculation an average value $T_{LID}$ is used as latch insertion delay time value.

Figure 7:
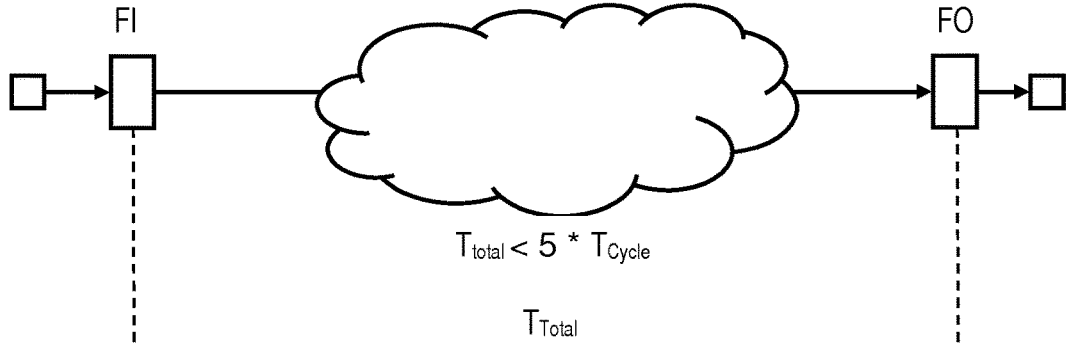
FIG. 7 is a schematic block diagram of the modified pipeline after performing the register replacement process.

FIG. 7 shows the modified pipeline 10B after performing the register replacement process comprising just the input register FI and the output register FO. Referring to FIG. 7 the only logic stage is represented by a cloud comprising the logic paths of the 5-stage pipeline 10A of an electronic circuit design of FIG. 6 wherein all pipeline registers F1 to F4 are replaced by wires. $T_{Total}$ represents a total cycle time value required to execute the logic paths of the 5-stage pipeline 10A. As depicted, the total cycle time $T_{Total}$ is smaller than the sum of the single cycle time values $T_{Cycle}$ of the logic stage S1 to S5 of the 5-stage pipeline 10A and the insertion delay time values $T_{LID1}$ to $T_{LID4}$ of the corresponding pipeline register F1 to F4.

Referring to FIG. 3, a method for pipeline depth exploration starts in step S200 with a first input register FI of the list of input registers for the circuit design to be modified. The method may be used, for example, to replace any register F1 to F4 in the circuit design shown in FIG. 6. In step S210 the instance outputs are traced to the next HDL instance of the register transfer level design description of the electronic circuit to be modified. Here the process starts with the input register FI and follows the logic paths of the first logic stage S1. If an HDL instance is reached, step S220 proofs if the HDL instance is from the type "Register". If the HDL instance is not from the type "Register", the process returns to step S210 and the next HDL instance is traced. If the HDL instance is from the type "Register" step S230 proofs if the HDL register corresponds to an output register RO listed on the list of output registers. If the HDL register corresponds not to an output register RO, the HDL register R1 to R4 is replaced by a respective HDL wire in step S240 and the process returns to step S210 and the next HDL instance is traced. If the HDL register corresponds to an output register RO, the process goes to the next input register RI on the list of input registers in step S250. In step S260 the process proofs if the current input register RI is the last register on the list of input registers. If yes, the replacement process is terminated. Else the replacement process returns to step S210 and the next HDL instance is traced.

Referring to FIG. 4, after replacing any register F1 to F4 between the input register FI and the output register FO the method for pipeline depth exploration starts in step S300 an automated synthesis run with calculating an initial total cycle time value $T_{Total}$ for the modified pipeline 10B. The initial total cycle time value $T_{Total}$ is calculated according to $((T_{Total})=(n*(T_{Cycle})-(n-1)\times(T_{LID}))$ with n representing the current pipeline depth of the electronic circuit design, and $T_{Cycle}$ representing the cycle time value, as stated above, and $T_{LID}$ representing an average latch insertion delay time value, as stated above. In step S310 a macro synthesis with the initial total cycle time value $T_{Total}$ is run on the modified electric circuit design comprising the modified pipeline 10B. In step S320 the process looks for negative slacks in the results of the macro synthesis run. In step S330 the process proofs if negative slacks are present in the results of the synthesis run. If yes, the process is terminated. Else, the process reduces the total cycle time value $T_{Total}$ by a given time step size in steps S340 and returns to step S310 to run a macro synthesis with the reduced total cycle time value $T_{Total}$ on the modified electric circuit design comprising the modified pipeline 10B. So the process reduces the total cycle time value $T_{Total}$ repetitively until negative slacks are present in the macro synthesis for the gate level description of the electric circuit design comprising the modified pipeline 10B.

Figure 8:
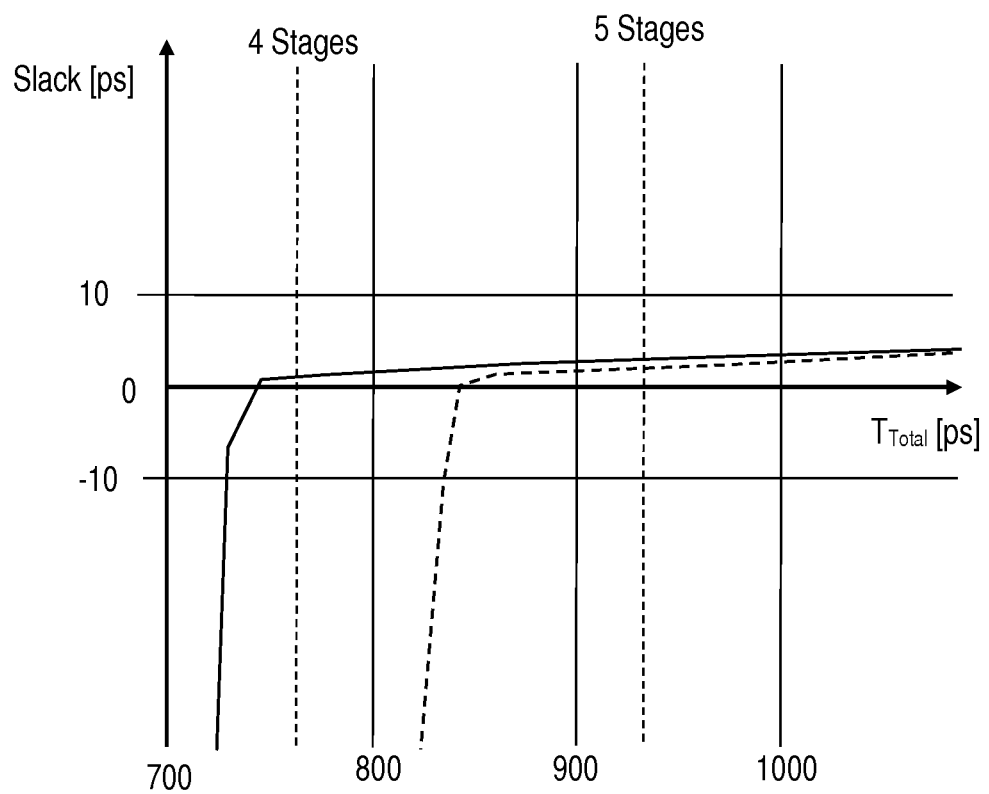
FIG. 8 is a schematic set of characteristic curves of results of a macro synthesis run block.

In the shown example, assuming an average cycle time value $T_{Cycle}$ of 208 ps and an average latch insertion time delay value $T_{LID}$ of 25 ps, the initial total cycle time value $T_{Total}$ is calculated as 940 ps. Referring to FIG. 8, the dashed curve represents a first case where the negative slack occurs at approximately at 830 ps so the pipeline 10A cannot be done in four stages and no stage can be saved. The solid curve modified represents a second case where the negative slack occurs at approximately at 750 ps so the pipeline 10A can be done in four stages and one stage can be saved. So the pipeline depth of the circuit design is reduced, since the total cycle time value $T_{Total}$ of the modified circuit design is lower than a certain threshold.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for pipeline depth exploration in a register transfer level design description of an electronic circuit, the method comprising:
   providing a list of input registers and output registers for said circuit design to be modified;
   traversing output connections paths for each input register and replacing any register in said output connection paths by a respective wire unless said register is contained in said list of output registers;
   determining an initial total cycle time value for said modified registerless circuit design accounting for a register latch insertion delay time value;
   obtaining a gate level description for said modified circuit design by macro synthesis with said initial total cycle time value; and
   varying the total cycle time value for said modified circuit design to determine a theoretical limit of said modified circuit design;
   wherein said theoretical limit of said modified circuit design is realized when negative slacks are present in the macro synthesis of said gate level description for said modified circuit design with a corresponding total cycle time value, wherein said total cycle time value is repetitively reduced by a given time step size until negative slacks are present in said macro synthesis for said gate level description of said modified design.

2. The method according to claim 1, wherein said initial total cycle time value is calculated according to $((T_{Total})=(n*(T_{cycle})-(n-1)*(T_{LID}))$ with n representing current pipeline depth of said circuit design, $T_{Total}$ representing the initial total cycle time value, $T_{Cycle}$ representing a cycle time value, and $T_{LID}$ representing the register latch insertion delay time value.

3. The method according to claim 2, wherein said pipeline depth of said circuit design is reduced, if said total cycle time value of said modified circuit design is lower than a certain threshold.

4. The method according to claim 1, wherein said theoretical limit of said modified circuit design comprises a maximum frequency or minimum pipeline depth of said circuit design.

5. A computer system for pipeline depth exploration in a register transfer level design description of an electronic circuit, said computer system comprising:
   a memory; and
   a processor in communication with said memory, wherein said computer system is configured to perform a method comprising:
      loading a list of input registers and output registers for said circuit design to be modified;
      traversing output connections paths for each input register and replacing any register in said output connection paths by a respective wire unless said register is contained in said list of output registers;
      determining an initial total cycle time value for said modified registerless circuit design accounting for a register latch insertion delay time value;
      obtaining a gate level description for said modified circuit design by macro synthesis with said initial total cycle time value; and
      varying the total cycle time value for said modified circuit design to determine a theoretical limit of said modified circuit design;
   wherein said theoretical limit of said modified circuit design is realized when negative slacks are present in the macro synthesis of said gate level description for said modified circuit design with a corresponding total cycle time value, wherein said processor reduces said total cycle time value repetitively by a given time step size until negative slacks are present in said macro synthesis for said gate level description of said modified design.

6. The computer system according to claim 5, wherein said processor calculates said initial total cycle time value according to $((T_{Total})=(n*(T_{Cycle})-(n-1)*(T_{LID}))$ with n representing a current pipeline depth of said circuit design, $T_{Total}$ representing the initial total cycle time value, $T_{Cycle}$ representing a cycle time value, and $T_{LID}$ representing the register latch insertion delay time value.

7. The computer system according to claim 6, wherein said processor reduces said pipeline depth of said circuit design, if said total cycle time value of said modified circuit design is lower than a certain threshold.

8. The computer system according to claim 5, wherein said theoretical limit of said modified circuit design comprises a maximum frequency or minimum pipeline depth of said circuit design.

9. A computer program product, the computer program product comprising a non-transitory computer readable storage medium having program instructions embodied therewith, the program instructions executable by a computer to cause the computer to perform a method for identifying a value of a minimum pipeline depth of a circuit design, the method comprising:

identifying the circuit design, the circuit design including a target input register, a target output register, and a plurality of intermediate registers electrically coupled between an output connection of the target input register and an input connection of the target output register, the circuit design having a value of a current pipeline depth;

generating a modified circuit design from the circuit design by replacing the plurality of intermediate registers with a plurality of wires;

running, with a target total cycle time value, a target macro synthesis for a gate level description of the modified circuit design;

obtaining, as a result of the running the target macro synthesis, negative slacks;

comparing, in response to the obtaining the negative slacks, the target total cycle time to a threshold;

determining, based on the comparing, that the value of the current pipeline depth of the circuit design is greater than the value of the minimum pipeline depth of the circuit design;

comparing, in response to the obtaining the negative slacks, the target total cycle time to a second threshold; and determining, based the comparing the target total cycle time to the second threshold, that the value of the minimum pipeline depth of the circuit design is greater than a value of a sub-minimum pipeline depth of the circuit design.

10. The computer program product of claim 9, wherein the circuit design further includes a set of registers, the set of registers including a group of input registers, the group of input registers including the target input register, the set of registers further including a group of output registers, the group of output registers including the target output register, and the set of registers further including a group of intermediate registers, the group of intermediate registers including the plurality of intermediate registers, and wherein the generating the modified circuit design from the circuit design by replacing the plurality of intermediate registers with the plurality of wires comprises:

identifying a first list and a second list, the first list including the group of input registers and the second list including the group of output registers; and traversing an output path from each output connection of each register included in the first list and replacing each register of the set of registers in the output path with a wire unless the register in the output path is included in the second list.

11. The computer program product of claim 9, wherein the method further comprises:

running, with a second total cycle time value that is greater than the target total cycle time value, a second macro synthesis of the gate level description of the modified circuit design; and obtaining, as a result of the running the second macro synthesis, non-negative slacks;

wherein the running the target macro synthesis on the modified circuit design occurs in response to the obtaining the non-negative slacks.

12. The computer program product of claim 11, wherein the method further comprises:

determining, by accounting for register latch insertion delay times associated with the plurality of intermediate registers, an initial total cycle time value for the modified circuit design;

running, with the initial total cycle time value, an initial macro synthesis for the gate level description of the modified circuit design; and determining, based on the initial total cycle time value, the second total cycle time value for the modified circuit design, wherein the second total cycle time value is less than the initial total cycle time value;

wherein the running the second macro synthesis occurs in response to the determining the second total cycle time value.

* * * * *